United States Patent
Neuendorffer et al.

(10) Patent No.: US 8,020,139 B1
(45) Date of Patent: Sep. 13, 2011

(54) METHOD AND APPARATUS FOR IMPLEMENTING A DATAFLOW CIRCUIT MODEL USING APPLICATION-SPECIFIC MEMORY IMPLEMENTATIONS

(75) Inventors: Stephen A. Neuendorffer, San Jose, CA (US); Ian D. Miller, Charlotte, NC (US)

(73) Assignee: Xilinx, Inc., San Jose, CA (US)

( * ) Notice: Subject to any disclaimer, the term of this patent is extended or adjusted under 35 U.S.C. 154(b) by 499 days.

(21) Appl. No.: 12/331,212

(22) Filed: Dec. 9, 2008

(51) Int. Cl.
*G06F 17/50* (2006.01)

(52) U.S. Cl. .................. 716/136; 716/138; 716/100

(58) Field of Classification Search .................. None
See application file for complete search history.

(56) References Cited

U.S. PATENT DOCUMENTS 7,761,272 B1 * 7/2010 Janneck et al. ............ 703/13

OTHER PUBLICATIONS

Geilen et al., "Minimising Buffer Requirements of Synchronous Dataflow Graphs with Model Checking," DAC 2005, pp. 819-824.*
Lee et al., "Classes and Subclasses in Actor-Oriented Design" 2004 IEEE, pp. 161-168.*

* cited by examiner

*Primary Examiner* — Leig Garbowski
(74) *Attorney, Agent, or Firm* — Robert M. Brush

(57) ABSTRACT

Method, apparatus, and computer readable medium for implementing a circuit model in an integrated circuit are described. In some examples, the circuit model includes a communication channel between actors. Data portions of at least one data object passed between the actors over the communication channel are identified. An implementation is generated for the circuit model in which data portions are assigned to either local queue storage of the communication channel or centralized shared storage of the communication channel based on levels of access thereof by the actors.

20 Claims, 4 Drawing Sheets

METHOD AND APPARATUS FOR IMPLEMENTING A DATAFLOW CIRCUIT MODEL USING APPLICATION-SPECIFIC MEMORY IMPLEMENTATIONS

FIELD OF THE INVENTION

One or more aspects of the present invention relate generally to integrated circuit design and, more particularly, to a method and apparatus for implementing a dataflow circuit model using application-specific memory implementations.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes an array of configurable logic blocks (CLBs), programmable input/output blocks (IOBs), and like type programmable elements. The CLBs and IOBs are interconnected by a programmable interconnect structure. An FPGA may also include various dedicated logic circuits, such as memories, digital clock managers (DCMs), and input/output (I/O) transceivers. Notably, an FPGA may include one or more embedded processors. The programmable logic of an FPGA (e.g., CLBs, IOBs, and interconnect structure) is typically programmed by loading a stream of configuration data (known as a bitstream) into internal configuration memory cells. The bitstream is typically stored in an external nonvolatile memory, such as an erasable programmable read only memory (EPROM). The states of the configuration memory cells define how the CLBs, IOBs, interconnect structure, and other programmable logic are configured.

When implementing systems in programmable logic fabrics, there can be two competing goals: maximizing data throughput and minimizing resource cost. Typically, in a dataflow system, this tradeoff appears in the implementation of communication buffers between dataflow actors. Generally, using dedicated communication queues allows for higher throughput, while using a shared memory is often architecturally cheaper in terms of resource cost. The tradeoff is particularly evident when transmitting large data objects from one actor to another, such as network packets in a router, frame data in a video decompression system, or the like. Currently, the allocation of data between higher throughput and architecturally cheaper storage is performed on a communication buffer specific basis (e.g., one particular buffer is implemented using queue storage, whereas another buffer is implemented using shared memory). Such an allocation does not account for the particular data application; i.e., the manner in which the data passing through the communication buffers is accessed by the actors.

Accordingly, there exists a need in the art for a method and apparatus for implementing a dataflow circuit model using application-specific memory implementations.

SUMMARY OF THE INVENTION

An aspect of the invention relates to a method, apparatus, and computer readable medium for implementing a circuit model in an integrated circuit. In some embodiments, the circuit model includes a communication channel between actors. Data portions of at least one data object passed between the actors over the communication channel are identified. An implementation is generated for the circuit model in which data portions are assigned to either local queue storage of the communication channel or centralized shared storage of the communication channel based on levels of access thereof by the actors.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1:
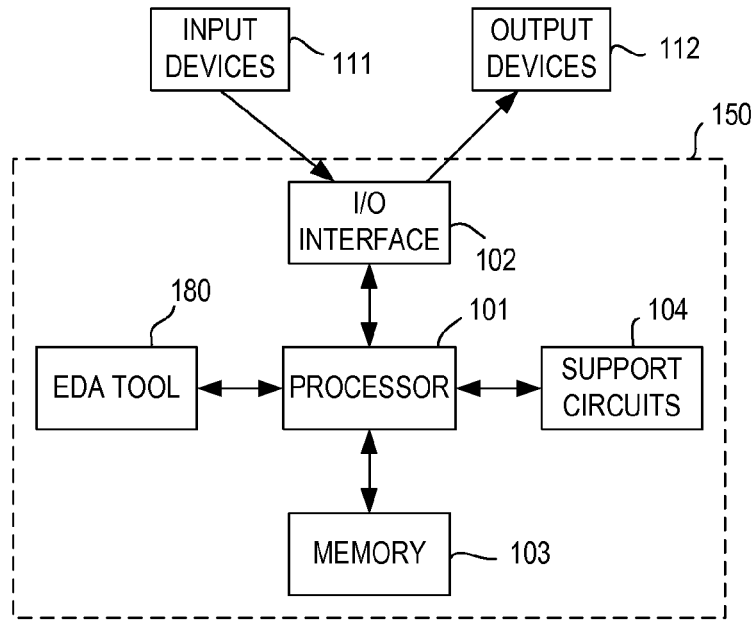
FIG. 1 is a block diagram depicting exemplary embodiments of a circuit design system for an integrated circuit in accordance with one or more aspects of the invention.

FIG. 1 is a block diagram depicting exemplary embodiments of a circuit design system 100 for an integrated circuit in accordance with one or more aspects of the invention. The circuit design system 100 includes a computer 150 having a processor 101, a memory 103, various support circuits 104, and an I/O interface 102. The processor 101 may include one or more microprocessors known in the art. The support circuits 104 for the processor 101 include conventional cache, power supplies, clock circuits, data registers, I/O interfaces, and the like. The I/O interface 102 may be directly coupled to the memory 103 or coupled through the processor 101. The I/O interface 102 can be coupled to various input devices 111 (e.g., keyboard, mouse, and the like) and output devices 112 (e.g., display, printer, and the like). The memory 103 may include one or more of the following random access memory, read only memory, magneto-resistive read/write memory, optical read/write memory, cache memory, magnetic read/write memory, and the like.

The computer 150 is further configured with an EDA tool 180. In some embodiments, the EDA tool 180 is implemented using software executable by the processor 101. The EDA tool 180 is configured to implement circuit models for ICs, as described in the embodiments below. In some embodiments, the EDA tool 180 can be implemented using hardware, firmware, software, or the like, or some combination thereof.

Figure 2:
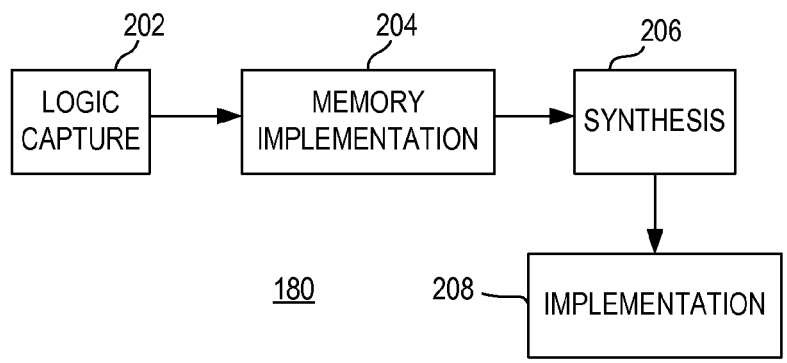
FIG. 2 is a block diagram of the electronic design automation (EDA) tool according to some embodiments of the invention.

FIG. 2 is a block diagram of the EDA tool 180 according to some embodiments of the invention. The EDA tool 180 includes a logic capture tool 202, a memory implementation tool 204, a synthesis tool 206, and an implementation tool 208. The term "tool" is meant to encompass hardware, software, and hardware/software embodiments. For example, the tools in the system 100 may be implemented using hardware, such as using one or more integrated circuits (e.g., an FPGA implementation) that is/are configured to perform the functions of the tools, as described herein. The tools in the system 100 may be part of one or more software programs stored in a memory and configured for execution by a processor (e.g., software executed by a computer). That is, the tools may be software modules. In yet another embodiment, the tools in the system 100 may be implemented using hardware (e.g., integrated circuit(s)) that is configured to perform the functions of the tools by execution of software. That is, the tools are hardware modules that execute software to perform their respective functions.

The logic capture tool 202 is configured to capture a circuit model from a user. The circuit model includes a plurality of circuit components, such as flip-flops, multiplexers, combinatorial logic, memories, and the like, connected together via signal conductors. In some embodiments, the circuit model represents a dataflow system, where functionality is captured as a collection of actors (encapsulated functionality) and communication channels through which data objects (encapsulated units of data) are passed from one actor to the next. In a dataflow system, there may be one or more communication channels between any two actors and each channel may employ different memory implementations, as described below. "Memory implementation" refers to the nature and type of physical memory resources used to implement a communication channel. In the circuit model, however, the memory implementations for the communication channels may be left undefined by the user. Rather, the memory implementations may be automatically defined by the memory implementation tool 204, as described below.

The memory implementation tool 204 is configured to receive the circuit model from the logic capture tool 202. The memory implementation tool 204 is configured to relate a type of memory implementation for each communication channel and the method used to determine the allocation of data among the memory implementations. The target implementation for each the communication channels can be a hybrid between two implementation approaches. Specifically, a communication channel may be implemented using both storage available in a centralized memory (e.g., a memory accessible via a bus shared among actors and/or other channels), as well as memory storage allocated in a local queue between actors (e.g., a first in first out (FIFO) memory). The centralized shared storage generally has lower bandwidth and lower implementation cost as compared with the local queue storage. The local queue storage generally has higher bandwidth and higher implementation cost. As described below, data that is sparsely accessed is stored in the centralized shared storage, whereas data that is densely accessed is stored in the local queue storage. It is important to note that in the circuit model, the user can define data objects that are natural to the algorithm. From the perspective of the user, these data objects may be stored in any physical location or split across multiple physical locations, as long as the system implementation maintains the logical association of the data object. Thus, it is entirely possible (and probable in many applications) for one portion of a single data object to be allocated to a centralized shared storage, while the remaining portion is stored in local queue storage.

The memory implementation tool 204 generates a modified circuit model (the circuit model from the logic capture tool 202 with memory implementations for the communication channels). The modified circuit model is provided to the synthesis tool 206. The synthesis tool 206 processes the modified circuit model to produce a logical description. The logical description can include a logical network list ("netlist") of lower-level circuit elements and logic gates, as well as connections (nets) between inputs and outputs thereof, in terms of a specific hierarchy. The implementation tool 208 is configured to produce a physical implementation for an IC from the netlist, such as a programmable logic device (PLD), field programmable gate array (FPGA), complex programmable logic device (CPLD), application specific integrated circuit (ASIC), or the like known in the art.

Figure 3:
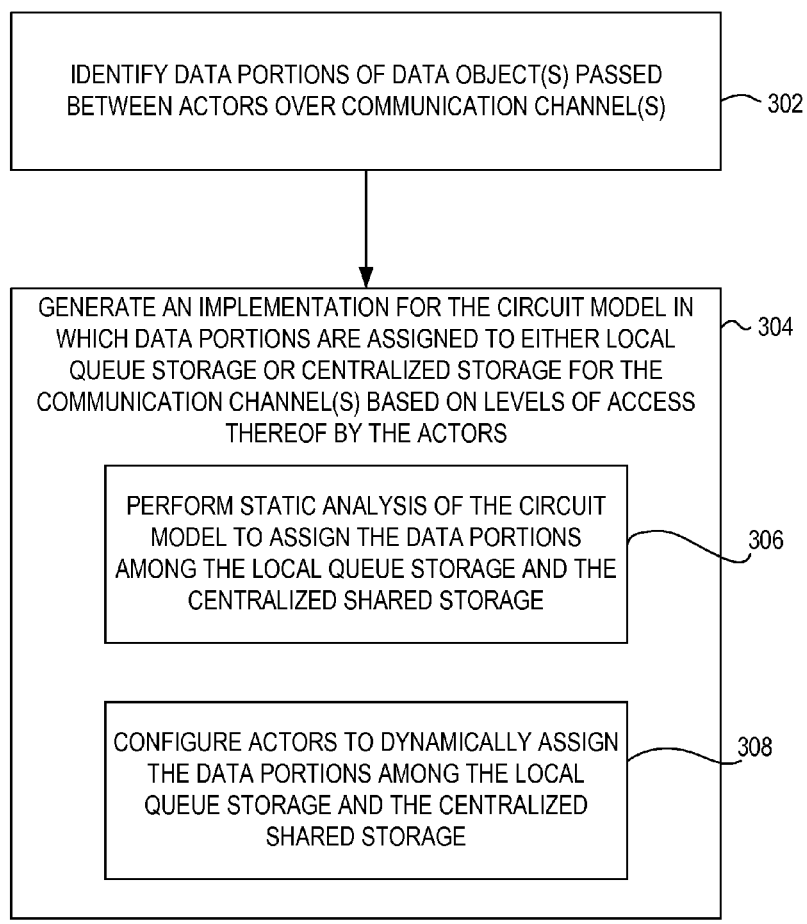
FIG. 3 is a flow diagram of a method for implementing a circuit model in an integrated circuit according to some embodiments of the invention.

FIG. 3 is a flow diagram of a method 300 for implementing a circuit model in an integrated circuit according to some embodiments of the invention. The method 300 may be performed by the memory implementation tool 204 of FIG. 2. The method 300 begins at step 302, where the memory implementation tool 204 identifies data portions of at least one data object passed between actors over communication channel (s). For example, a data object may be a structure, class, or the like having one or more elements, fields, member variables, or the like (generally referred to as data elements). A particular data element is a portion of the data object.

At step 304, the memory implementation tool 204 generates an implementation for the circuit model in which data portions are assigned to either local queue storage or centralized shared storage for the communication channel(s) based on levels of access thereof by the actors. A "level of access" refers to a measure of use of the data portion by the actors. For example, a level of access may be the number of times the data portion is accessed by the actors in the circuit model. The centralized shared storage may comprise one or more memories capable of shared access by the actors. The local queue storage may comprise one or more queues (e.g., FIFOs) for each of the communication channels. Thus, the memory implementation for each of the communication channels is based on the manner in which data is passed through the communication channels by the actors and is thus tailored to the particular application of a dataflow system defined by the user.

In some embodiments, actors may unconditionally access particular data portions, enabling the presence of such accesses to be determined from the circuit model. The assignment of data portions unconditionally accessed by actors between local queue storage and centralized shared storage can be determined statically, based on the presence of such accessed determined from static analysis of the circuit model (step 306). In other embodiments, actors may conditionally access particular data portions based on data presented to the circuit during run-time. Thus, access to such data portions cannot be determined by static analysis of the circuit model. In some embodiments, the actors are configured such that assignment of data portions dynamically accessed by the actors among the local queue storage and the centralized shared storage can be determined dynamically during run-time based on the data present during a particular execution (step 308). In other embodiments, the assignment of data portions conditionally accessed by actors may be made statically based on static program analysis or code profiling, at the expense of making possibly suboptimal assignment (step 306).

Figure 4:
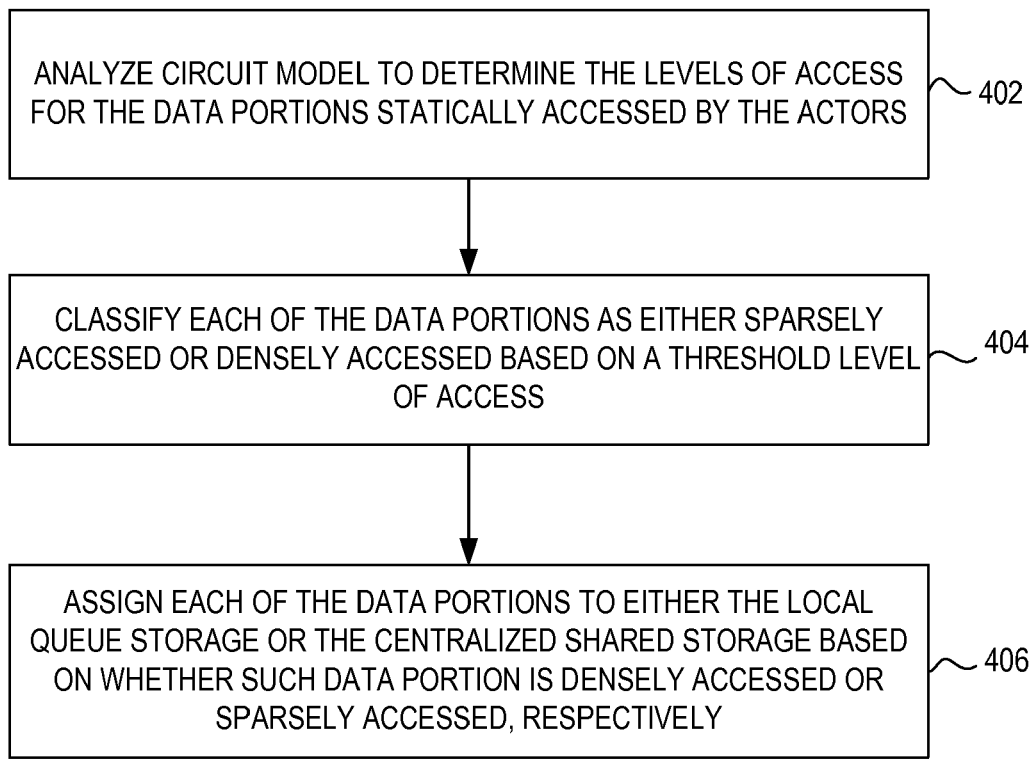
FIG. 4 is a flow diagram depicting a method of static analysis of a circuit model to assign data portions among local queue storage and centralized shared storage according to some embodiments of the invention.

FIG. 4 is a flow diagram depicting a method 400 of static analysis of the circuit model to assign data portions among local queue storage and centralized shared storage according to some embodiments of the invention. The method 400 may be performed as step 306 in the method 300. The method 400 begins at step 402, where the circuit model is analyzed to determine the levels of access for the data portions statically accessed by the actors. For example, a level of access may be a number of accesses to a data portion by the actors as set forth explicitly in the circuit model. In other words, a level of access is a weight assigned to the data portion. At step 404, each of the data portions is classified as either sparsely accessed or densely accessed based on a threshold level of access. A data portion can be classified as sparsely accessed if its level of access does not satisfy the threshold level. Conversely, a data portion can be classified as densely accessed if its level of access does satisfy the threshold level.

At step 406, each of the data portions is assigned to either the local queue storage or the centralized shared storage based on whether such data portion is densely access or sparsely accessed, respectively. Hence, a range of memory implementations can be produced by varying the threshold access level. For example, a high threshold access level may generate a system in which the majority of data portions are assigned to the centralized shared storage. Conversely, a low threshold access level may generate a system in which the majority of data portions are assigned to the local queue storage. The threshold access level can be set to generate a system with a desired balance between centralized shared memory and local queue storage.

Returning to FIG. 3, in some embodiments, the data portions in the circuit model are immutable once transmitted from one actor to another actor. That is, a modification to a data portion by one actor cannot cause a side effect that is visible to another actor without the data portion being explicitly communicated from the one actor to the other actor. In some embodiments, the immutable behavior of data portions can be implemented using a copy-on-write technique. That is, the implementation can be generated at step 304 such that writes to the local queue storage (i.e., storage of data portions in the local queue storage) by the actors are also copied to the shared centralized storage. Thus, the centralized shared storage can store all of the data portions, some of which are also stored in the local queue storage to provide a cache for the centralized shared memory.

As noted above, in some cases, one or more of the data portions are dynamically accessed by the actors during run-time and thus these data portions cannot be assigned by static analysis of the circuit model. In some embodiments, the implementation is generated at step 304 such that a plurality of the data portions is dynamically assigned to the local queue storage according to an algorithm that tracks the levels of access of the data portions by the actors during run-time. In essence, the local queue storage behaves as a cache for the centralized shared storage. In embodiments that employ copy-on-write as noted above, the cache is always consistent with the centralized shared memory. Various caching algorithms may be employed, such as least recently used (LRU), most recently used (MRU), and the like. In general, rather than determining the levels of access statically from the circuit model, the levels of access are tracked by the particular cache algorithm employed. In addition to storing the plurality of data portions, the local queue storage is also configured to store access information associated with the plurality of data portions that is maintained by the cache algorithm (e.g., data that can be used to determine a least recently used data portion for an LRU algorithm or a most recently used data portion for an MRU algorithm). In the dynamic case, an actor may use a data portion as obtained from the local queue storage, or the actor may bypass the "cache" and directly access the centralized shared memory.

Figure 5:
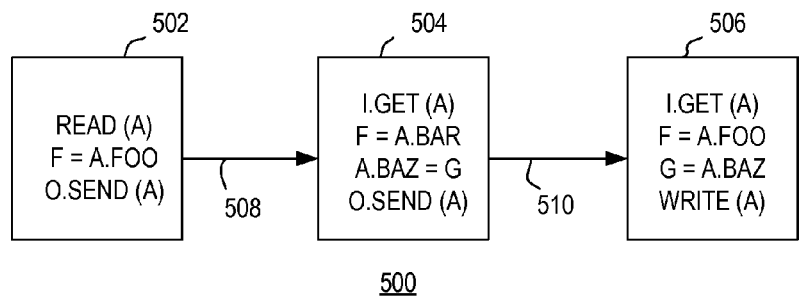
FIG. 5 is a block diagram depicting an exemplary circuit model according to some embodiments of the invention.

FIG. 5 is a block diagram depicting an exemplary circuit model 500 according to some embodiments of the invention. The circuit model 500 is a simplified example for use in understanding aspects of the invention. The circuit model 500 includes actors 502, 504, and 506. A communication channel 508 couples an output port of the actor 502 with an input port of the actor 504. A communication channel 510 couples an output port of the actor 504 with an input port of the actor 506. The actors 502-506 encapsulate functionality that employs a data object "A". In particular, the actor 502 includes the following functionality:

Read (A)
F=A.foo
O.Send (A)

"Read (A)" defines a new data object A and assigns values to its data portions. One portion of data object A is A.foo, which is assigned to a local variable "F". The data object A is then sent over the communication channel 508 via the output port of the actor 502.

The actor 504 includes the following functionality:

I.Get(A)
F=A.bar
A.baz=G
O. Send(A)

"I.Get(A)" obtains the data object A from the communication channel 508 via the input port of the actor 504. Another portion of the data object A is A.bar, which is assigned to a local variable "F". Another portion of the data object A is A.baz, which is assigned a value of another local variable "G". The data object A is then sent over the communication channel 510 via the output port of the actor 504.

The actor 506 includes the following functionality:

I.Get(A)
F=A.foo
G=A.baz
Write(A)

"I.Get(A)" obtains the data object A from the communication channel 510 via the input port of the actor 508. The data portion A.foo is assigned to a local variable "F". The data portion A.baz is assigned to a local variable "G". "Write(A)" outputs the values of the data portions of the data object A (e.g., A.foo, A.bar, and A.baz).

Figure 6:
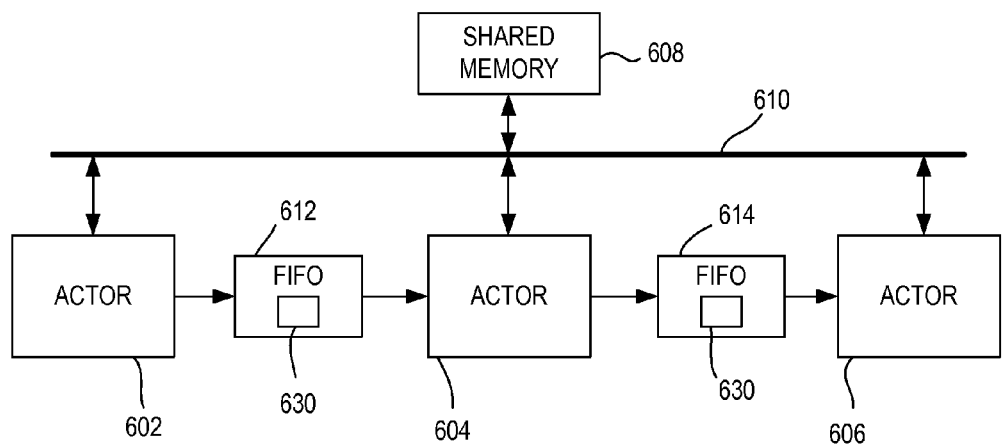
FIG. 6 is a block diagram depicting an exemplary modified circuit model having a memory implementation according to some embodiments of the invention.

FIG. 6 is a block diagram depicting an exemplary modified circuit model 600 having a memory implementation according to some embodiments of the invention. The modified circuit model 600 may be produced by the memory implementation tool 204 after processing the circuit model 500 of FIG. 5. The modified circuit model 600 includes actor implementations 602, 604, and 606 that are implementations of the actors 502, 504, and 506, respectively. The modified circuit model 600 further includes a shared memory 608, a bus 610, a FIFO memory 612, and a FIFO memory 614. The FIFO 612 couples an output of the actor 602 to an input of the actor 604. The FIFO 614 couples an output of the actor 604 to an input of the actor 606. Each of the actors 602-606 is coupled to the shared memory 608 through the bus 610. The communication channel 508 is implemented using both the shared memory 608 and the FIFO memory 612. The communication channel 510 is implemented using the shared memory 608 and the FIFO memory 614.

In the present example, access to the data portions of the data object A are statically defined and thus the allocation of the data object A among the shared memory 608 and the FIFO memories 612 and 614 can be determined by the memory implementation module 204 using static analysis of the circuit model 500. In the present example, it can be seen that A.foo is accessed twice, once by the actor 502 and once by the actor 506. Likewise, A.baz is accessed twice, once by the actor 504 and once by the actor 506. The data portion A.bar is only accessed once by the actor 504. Assume for purposes of the present example that A.foo and A.baz are deemed densely accessed, and A.bar is deemed to be sparsely accessed. Thus, in some embodiments, the data portions A.foo and A.baz are assigned to local queue storage (e.g., the FIFO memories 612 and 614). The data portion A.bar is stored in centralized shared memory (e.g., the shared memory 608).

The actor implementations 602-606 are configured to target accesses to the data portions to the correct memory resources. For example, the actor implementation 602 accesses the data object A and the data portion A.foo from the shared memory 608. The actor implementation 604 accesses both the data portions A.bar and A.baz from the shared memory 608. The actor implementation 606 accesses the data portions A.foo and A.baz from the FIFO memory 614, and accesses the remaining data portions of object A (e.g., A.bar) from the shared memory 608. The memory implementation tool 204 is configured to modify the actors 502-506 to target the appropriate memory resources based on the particular data portion being accessed to produce the actor implementations 602-606.

In some embodiments, the entire data object A may be stored in the shared memory 608, including the data portions assigned to the FIFO memories 612 and 614. As noted above, in such case, the FIFO memories 612 and 614 behave as a cache for the shared memory 608. Cache coherence may be maintained using a write-through technique, for example. That is, when the actor implementation 602 writes A.foo to the FIFO memory 612, the actor implementation 602 can also write A.foo to the shared memory 608. Likewise, when the actor implementation 604 writes A.foo and A.baz to the FIFO memory 614, the actor implementation 604 can also write A.foo and A.baz to the shared memory 608.

In some embodiments, the actor implementations 602 and 604 pass at least one pointer 630 through the FIFO memories 612 and 614 that can be used to access the data object A in the shared memory 608. The pointer(s) 630 may be passed along with the data in various formats. In some embodiments, a data stream through a FIFO between actors may be structured to include N-bit data words (e.g., 8-bit data words). For each pointer, one or more of the N bits may be used to indicate the assignment of a respective pointed-to data portion between centralized shared storage (e.g., the shared memory 608) and local queue storage (e.g., a FIFO 612, 614). The remaining bits of the N bit word may provide either an address in the shared memory 608 for the respective pointed-to data, or an indication of the number of succeeding words to be read from the FIFO that correspond to the respective pointed-to data.

Aspects of the methods described above may be implemented as a program product for use with a computer system. Program(s) of the program product defines functions of embodiments and can be contained on a variety of computer readable media, which include, but are not limited to: (i) information permanently stored on non-writable storage media (e.g., read-only memory devices within a computer such as CD-ROM or DVD-ROM disks readable by a CD-ROM drive or a DVD drive); and (ii) alterable information stored on writable storage media (e.g., floppy disks within a diskette drive or hard-disk drive or read/writable CD or read/writable DVD). Such computer readable media, when carrying computer-readable instructions that direct functions of the invention, represent embodiments of the invention.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. A method of implementing a circuit model in an integrated circuit, the circuit model having a communication channel between actors, the method comprising:
   identifying, by a processor, data portions of at least one data object passed between the actors over the communication channel; and
   generating an implementation for the circuit model in which data portions are assigned to either local queue storage of the communication channel or centralized shared storage of the communication channel based on levels of access thereof by the actors.

2. The method of claim 1, wherein the step of generating comprises:
   analyzing the circuit model to determine the levels of access for the respective data portions by the actors;
   classifying each of the data portions as sparsely accessed if the level of access thereof does not satisfy a threshold level, or densely accessed if the level of access thereof satisfies the threshold level; and
   assigning each of the data portions to either the local queue storage or the centralized shared storage based on whether such data portion is densely accessed or sparsely accessed, respectively.

3. The method of claim 2, wherein the implementation is generated such that writes to the local queue storage by the actors are copied to the centralized shared storage.

4. The method of claim 2, wherein the implementation is generated such that the actors pass at least one pointer through the local queue storage for accessing at least one data portion stored in the centralized shared storage.

5. The method of claim 1, wherein the implementation is generated such that a plurality of the data portions is dynamically assigned to the local queue storage according an algorithm that tracks the levels of access of the data portions by the actors.

6. The method of claim 5, wherein the implementation is generated such that writes to the local queue storage by the actors are copied to the centralized shared storage.

7. The method of claim 5, wherein the implementation is generated such that the actors pass at least one pointer through the local queue storage for accessing at least one data portion stored in the centralized shared storage.

8. Apparatus for implementing a circuit model in an integrated circuit, the circuit model having a communication channel between actors, the apparatus comprising:
   means for identifying data portions of at least one data object passed between the actors over the communication channel; and
   means for generating an implementation for the circuit model in which data portions are assigned to either local queue storage of the communication channel or centralized shared storage of the communication channel based on levels of access thereof by the actors.

9. The apparatus of claim 8, wherein the means for generating comprises:
   means for analyzing the circuit model to determine the levels of access for the respective data portions by the actors;
   means for classifying each of the data portions as sparsely accessed if the level of access thereof does not satisfy a threshold level, or densely accessed if the level of access thereof satisfies the threshold level; and
   means for assigning each of the data portions to either the local queue storage or the centralized shared storage based on whether such data portion is densely accessed or sparsely accessed, respectively.

10. The apparatus of claim 9, wherein the implementation is generated such that writes to the local queue storage by the actors are copied to the centralized shared storage.

11. The apparatus of claim 9, wherein the implementation is generated such that the actors pass at least one pointer through the local queue storage for accessing at least one data portion stored in the centralized shared storage.

12. The apparatus of claim 8, wherein the implementation is generated such that a plurality of the data portions is dynamically assigned to the local queue storage according an algorithm that tracks the levels of access of the data portions by the actors.

13. The apparatus of claim 12, wherein the implementation is generated such that writes to the local queue storage by the actors are copied to the centralized shared storage.

14. The apparatus of claim 12, wherein the implementation is generated such that the actors pass at least one pointer through the local queue storage for accessing at least one data portion stored in the centralized shared storage.

15. A computer readable medium have stored thereon instructions that when executed by a processor cause the process to perform a method of implementing a circuit model in an integrated circuit, the circuit model having a communication channel between actors, the method comprising:
   identifying data portions of at least one data object passed between the actors over the communication channel; and
   generating an implementation for the circuit model in which data portions are assigned to either local queue storage of the communication channel or centralized shared storage of the communication channel based on levels of access thereof by the actors.

16. The computer readable medium of claim 15, wherein the step of generating comprises:
   analyzing the circuit model to determine the levels of access for the respective data portions by the actors;
   classifying each of the data portions as sparsely accessed if the level of access thereof does not satisfy a threshold level, or densely accessed if the level of access thereof satisfies the threshold level; and
   assigning each of the data portions to either the local queue storage or the centralized shared storage based on whether such data portion is densely accessed or sparsely accessed, respectively.

17. The computer readable medium of claim 16, wherein the implementation is generated such that writes to the local queue storage by the actors are copied to the centralized shared storage.

18. The computer readable medium of claim 16, wherein the implementation is generated such that the actors pass at least one pointer through the local queue storage for accessing at least one data portion stored in the centralized shared storage.

19. The computer readable medium of claim 15, wherein the implementation is generated such that a plurality of the data portions is dynamically assigned to the local queue storage according an algorithm that tracks the levels of access of the data portions by the actors.

20. The computer readable medium of claim 19, wherein the implementation is generated such that writes to the local queue storage by the actors are copied to the centralized shared storage; and wherein the implementation is generated such that the actors pass at least one pointer through the local queue storage for accessing at least one data portion stored in the centralized shared storage.

* * * * *